(12) United States Patent
Balasinski et al.

(10) Patent No.: US 6,562,638 B1
(45) Date of Patent: May 13, 2003

(54) INTEGRATED SCHEME FOR PREDICTING YIELD OF SEMICONDUCTOR (MOS) DEVICES FROM DESIGNED LAYOUT

(75) Inventors: Artur Balasinski, Cupertino, CA (US); Robert C. Pack, Foster City, CA (US); Valery Axelrad, Woodside, CA (US); Victor Vladimir Boksha, Los Altos, CA (US)

(73) Assignees: Cypress Semiconductor Corp., San Jose, CA (US); Cadence Design Systems, Inc., San Jose, CA (US); Sequoia Design Systems, Woodside, CA (US)

( * ) Notice: Subject to any disclaimer, the term of this patent is extended or adjusted under 35 U.S.C. 154(b) by 0 days.

(21) Appl. No.: 09/753,137

(22) Filed: Dec. 29, 2000

Related U.S. Application Data

(60) Provisional application No. 60/173,734, filed on Dec. 30, 1999.

(51) Int. Cl.[7] .............................................. G01R 31/26
(52) U.S. Cl. .......................... 438/14; 438/15; 438/17; 716/1; 716/4; 716/19
(58) Field of Search ........................... 438/14, 15, 17, 438/197; 716/1, 4, 5, 19

(56) References Cited

U.S. PATENT DOCUMENTS

| | | | | |
|---|---|---|---|---|
| 5,723,233 A | * | 3/1998 | Garza et al. | 430/5 |
| 6,016,562 A | * | 1/2000 | Miyazaki et al. | 714/724 |
| 6,291,855 B1 | * | 9/2001 | Chang et al. | 257/316 |
| 6,309,934 B1 | * | 10/2001 | Peckerar et al. | 438/299 |
| 6,368,884 B1 | * | 4/2002 | Goodwin et al. | 438/14 |

OTHER PUBLICATIONS

C.H. Stapper, F.M. Armstrong, and K. Saji, "Integrated Circuit Yield Statistics," Proc. IEEE 71(4), Apr. 1983.
W. Maly, A.J. Strojwas and S.W. Director, "VLSI Yield Prediction and Estimation: a Unified Framework," IEEE Trans. CAD, CAD-5 (1), pp. 114–130 (1986).
C. Mack, "Yield Modeling for Photolithography," Proc. Of the Interface '94 Conf., pp. 171–182, (1994).
R.C. Pack, "Optimization of the Photolithographic Process through Coupled Process and Device Simulation and Design Centering," KTI Microlithography Symposium 1990.
F.M. Schellenberg, V. Boksha, N. Cobb, J.C. Lai, C.H. Chen, C. Mack, Impact of Mask Errors on Full Chip Error Budgets, SPIE Microlithography, Mar. 1999.

* cited by examiner

*Primary Examiner*—Amir Zarabian
*Assistant Examiner*—Pamela Perkins
(74) *Attorney, Agent, or Firm*—Sonnenschein Nath & Rosenthal

(57) ABSTRACT

A method for determining device yield of a semiconductor device design, includes determining statistics of at least one MOSFET parameter from a gate pattern, and calculating device yield from the at least one MOSFET parameter. The method provides a direct simulation link from device layout to device performance.

11 Claims, 15 Drawing Sheets

Fig. 9A
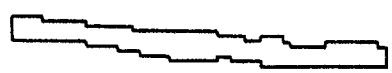
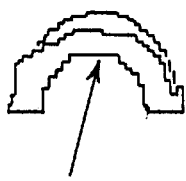
15 nm
Fig. 9B
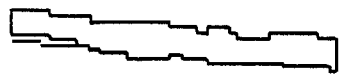
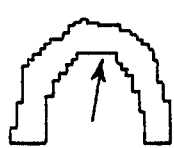
<5 nm
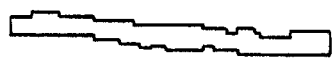
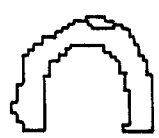
8 nm
Fig. 9C
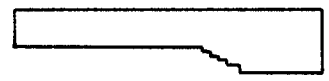
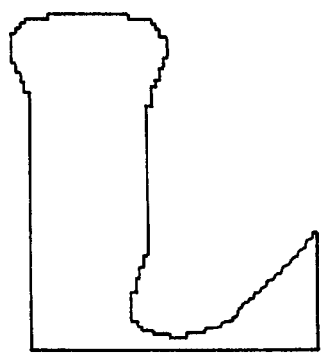
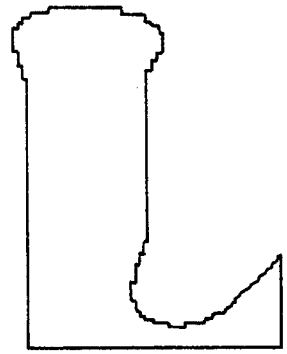
Fig. 10A
Fig. 10B

INTEGRATED SCHEME FOR PREDICTING YIELD OF SEMICONDUCTOR (MOS) DEVICES FROM DESIGNED LAYOUT

RELATED APPLICATIONS

The present application is based on provisional patent application serial No. 60/173,734, filed Dec. 30, 1999, hereby incorporated by reference.

BACKGROUND OF THE INVENTION

The present invention relates to an integrated scheme for predicting yield of semiconductor devices.

Within-chip variability of critical features such as polycrystalline silicon (poly) lines due to limitations of manufacturing processes is a major cause of device variability and product yield loss in semiconductor devices. A significant fraction of this variability is a deterministic function of local layout patterns and properties of the manufacturing processes (lithography, etch, etc.). In particular, optical proximity effects on the poly layer can degrade transistor parameters or even lead to catastrophic failures, such as shorts or opens. Gate length variability is the main source of circuit-level variation and a major performance and yield limiter. Sensitivity of transistor performance to gate critical dimension (CD) is a strong function of transistor architecture and, thus, the front-end manufacturing process.

Reducing circuit-level variability can be achieved at two levels:

(a) in the design phase, by applying Optical Proximity Correction (OPC) techniques to improve pattern reproduction.

(b) in the process development or manufacturing phase of a product, by reducing sensitivity of active devices to pattern fidelity.

Optical Proximity Correction serifs (or hammerheads) that enhance pattern resolution on wafers for deep submicron layouts are particularly vulnerable to the quality of the mask making process. Placement on line ends and in layout corners subjects the serifs to process-induced rounding. Also, the designed serif size, often much smaller than that of MOSFET channels and connecting lines, is close to the mask resolution limits and therefore difficult to control. At the same time, for layouts of extreme densities, such as those in high performance SRAM cells, device tolerance for line end rounding requires highly accurate serif reproduction. The differences between the drawn and on-mask serif size and shape, as well as intramask variation, may no longer guarantee transistor performance within specified limits. However, state of the art simulation tools assume a perfect process of pattern transfer from layout to mask, with no margin for variations of OPC serif size. While the latitude of such a process could impact transistor parameters, no work has been done to link its accuracy to the final yield loss due to MOSFET degradation. Only the MOSFET parameters are used to determine device yield.

Photolithographic simulations can approximate photoresist patterns. In such a simulation, the pattern is first drawn. Then optical simulation can be used to simulate the photoresist patterns. The photoresist patterns can be used to determine the gate pattern.

The photolithographic simulations (drawing of pattern, optical simulation, and determination of gate pattern) could not be easily, or previously coupled with systems for determining device yield (determining MOSFET parameters, then determining device yield from the parameters) because there was no way to transform the results of the photolithographic simulations into a form usable by the software for determining device yield.

BRIEF SUMMARY

In a first aspect, the present invention is a method for determining device yield of a semiconductor device design, including determining statistics of at least one MOSFET parameter from a gate pattern, and calculating device yield from the at least one MOSFET parameter.

In a second aspect, the present invention is a method of preparing a semiconductor device, including determining the device yield of a semiconductor device design, and producing a device corresponding to the semiconductor device design.

In a third aspect, the present invention is a computer program product on a computer readable medium, for determining device yield, including code in the computer readable medium for causing a computer to determine statistics of at least one MOSFET parameter from a gate pattern, and code in the computer readable medium for causing a computer to calculate device yield from the at least one MOSFET parameter.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIGS. 9a, b and c, are a comparison of the accuracy of the overlays of FIGS. 8a, b and c, respectively.

DETAILED DESCRIPTION

Figure 1:
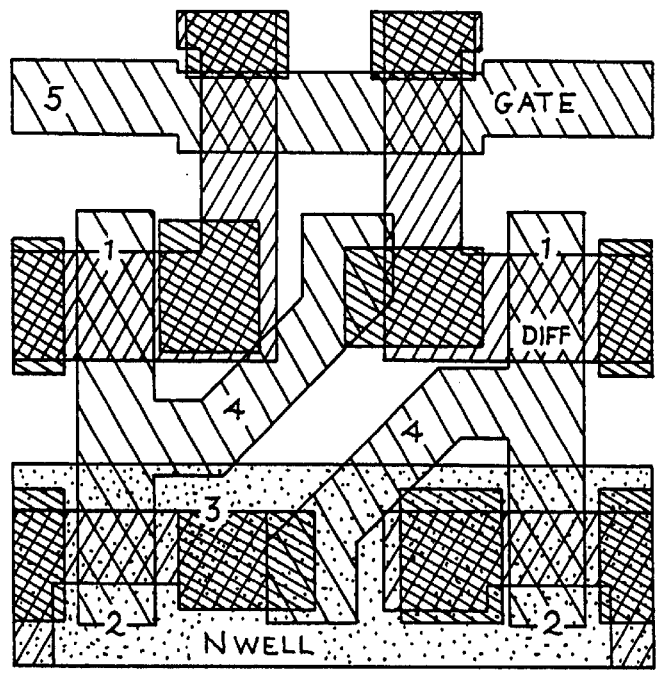
FIG. 1 illustrates key layers of an SRAM cell.

The present invention bridges the gap between photolithographic simulations and determination of device yield. The present invention includes determining statistics of at least one MOSFET parameter, from the gate pattern derived by photolithographic simulations. The statistics of one or more MOSFET parameters may then be used to determine device yield.

The present invention may include producing a statistical description of the channel Lpoly (gate length), or poly linewidth, from photolithographic simulation, producing a statistical description of the device (MOSFET) parameters (which may be a function of Lpoly), such as drive current, drive current, etc., and then calculate the device yield. The statistical description of one or more MOSFET parameters may be in the form of a histogram.

The invention also includes a comprehensive methodology aimed at predicting and optimizing product yield and performance by improving pattern control and reducing device sensitivity to the quality of pattern reproduction. Pattern variability is first statistically characterized at the full-chip level, for example by OPC software. Its effects on device performance are then captured, for example by SEQUOIA DESIGN SYSTEMS' Device Designer software. Expected product yield and performance are extracted from the generated statistical distributions of transistor parameters. Optionally, all the steps may be preformed together: drawing of the pattern, optical simulating, determining gate pattern, determining statistics of one or more MOSFET parameters, and calculating yield. Other optional steps that may also be included are adjusting the drawing of the pattern one or more time, to improve the yield, and producing the device.

The overall yield of semiconductor devices can be calculated as the product of a random component and a deterministic component:

$$Y\text{total} \sim Y\text{deterministic} \cdot Y\text{random} \quad (EQ\ 1)$$

The deterministic component describes effects associated with pattern fidelity and the resulting circuit variability and performance degradation. The random component captures effects such as particle contamination. While a product's sensitivity to particle contamination is a function of the layout and, although random, will generally be different for different products manufactured in the same fab (C. H. Stapper, F. M. Armstrong, and K. Saji, "Integrated Circuit Yield Statistics," Proc. IEEE 71(4), April 1983; W. Maly, A. J. Strojwas, and S. W. Director, "VLSI Yield Prediction and Estimation: a Unified Framework," IEEE Trans. CAD, CAD-5 (1), pp. 114–130 (1986)), these issues are not included in the simulation.

The deterministic component may be further subdivided into catastrophic and parametric yield losses. Catastrophic yield loss occurs due to, e.g., shorts and opens. Parametric yield losses represent circuit failures due to transistor or interconnect parameters falling out of tolerable bounds, which are usually represented by specification (spec) limits.

$$Y\text{deterministic} \sim Y\text{catastrophic} \cdot Y\text{parametric} \quad (EQ\ 2)$$

Since pattern fidelity degradation is the cause of deterministic yield loss, a lithography-related yield has been suggested as an estimate in C. Mack, "Yield Modeling for Photolithography," Proc. of the Interface '94 Conf., pp. 171–182, (1994), and R. C. Pack, "Optimization of the Photolithographic Process through Coupled Process and Device Simulation and Design Centering," KTI Microlithography Symposium 1990, and extended for full-chip applications in F. M. Schellenberg, V. Boksha, N. Cobb, J. C. Lai, C. H. Chen, C. Mack, "impact of Mask Errors on Full Chip Error Budgets," SPIE Microlithography, March 1999:

$$Y_{FullChipLitho} = (\text{full chip count of CD within spec})/(\text{full chip count of all CD}) \quad (EQ\ 3)$$

The proper choice of spec limits will, in general, depend on the product and its performance targets. In particular, parametric yield loss will depend substantially on transistor and circuit architecture.

Given the extremely large number of individual pattern elements in modern VLSI designs, statistical techniques are preferably used to capture pattern information in a form usable for further analysis. As an example, two measures of pattern fidelity which may be captured statistically are variation of line-end position and variation of linewidth.

Example 1 demonstrates the capability of the procedure to establish requirements regarding placement of MOSFET gates, endcap length and proximity to other poly lines. The simulation may also be used to determine the tradeoff between the cell size and the toolset used in the manufacturing process. Example 2 demonstrates yield and performance improvements due to both enhancement of pattern fidelity by full-chip OPC and by desensitization of device parameters to pattern reproduction.

EXAMPLE 1

MOSFET parametric yield loss related to the process window of pattern generation was evaluated. In the novel two-step procedure, the shape of MOSFET gates was simulated, by first simulating the mask followed by simulating the photoresist pattern. In the process, the simulation was subsequently calibrated to SEM images of the mask and of the poly pattern on the wafer. Device parameters were then extracted for serif sizes and misalignment corresponding to the mask making and photolithography process windows. We used high density, single wordline six transistor SRAM cell for 0.16 $\mu$m technology with complex OPC based mostly on hammerhead serifs. All optical simulations were done using PROLITH2 software from FINLE, and device/yield simulations on SEQUOIA DEVICE DESIGNER (SEQUOIA DEVICE DESIGNER User's Guide, SEQUOIA DESIGN SYSTEMS, 1999).

SRAM Cell

FIG. 1 shows the key layers of the single wordline 6T SRAM cell. While its area of 2.3 $\mu$m$^2$ should be considered as small for the set of design rules (M. Ishida et al., p.201, Proc. IEDM, 1998), the design is challenging due to the complex poly layout. It requires simultaneous optimization of FET channel CDs, contact areas (feature 1 in FIG. 1), and proximity corrections: line-end-to-line (feature 1 to feature 5 in FIG. 1) and line-end-to-line-end (feature 2 in FIG. 1 to feature 2 of the neighboring cell).

Figure 3:
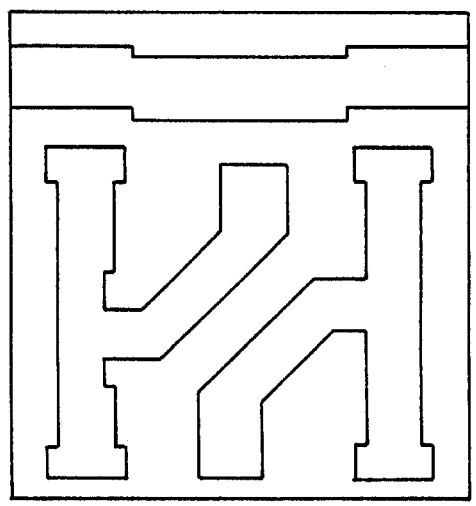
FIG. 3 shows a poly gate layer with serifs added by CAD flow.

To realize the cell, line end serifs were proposed based on an initial round of the simulation, to arrive at cell layout as shown in FIG. 3. Sensitivity of the cell to OPC features, as measured by transistor performance corresponding to the variations of pattern transfer from design to wafer, was verified below.

Simulation Procedure

A. Optical Simulation.

Figure 2:
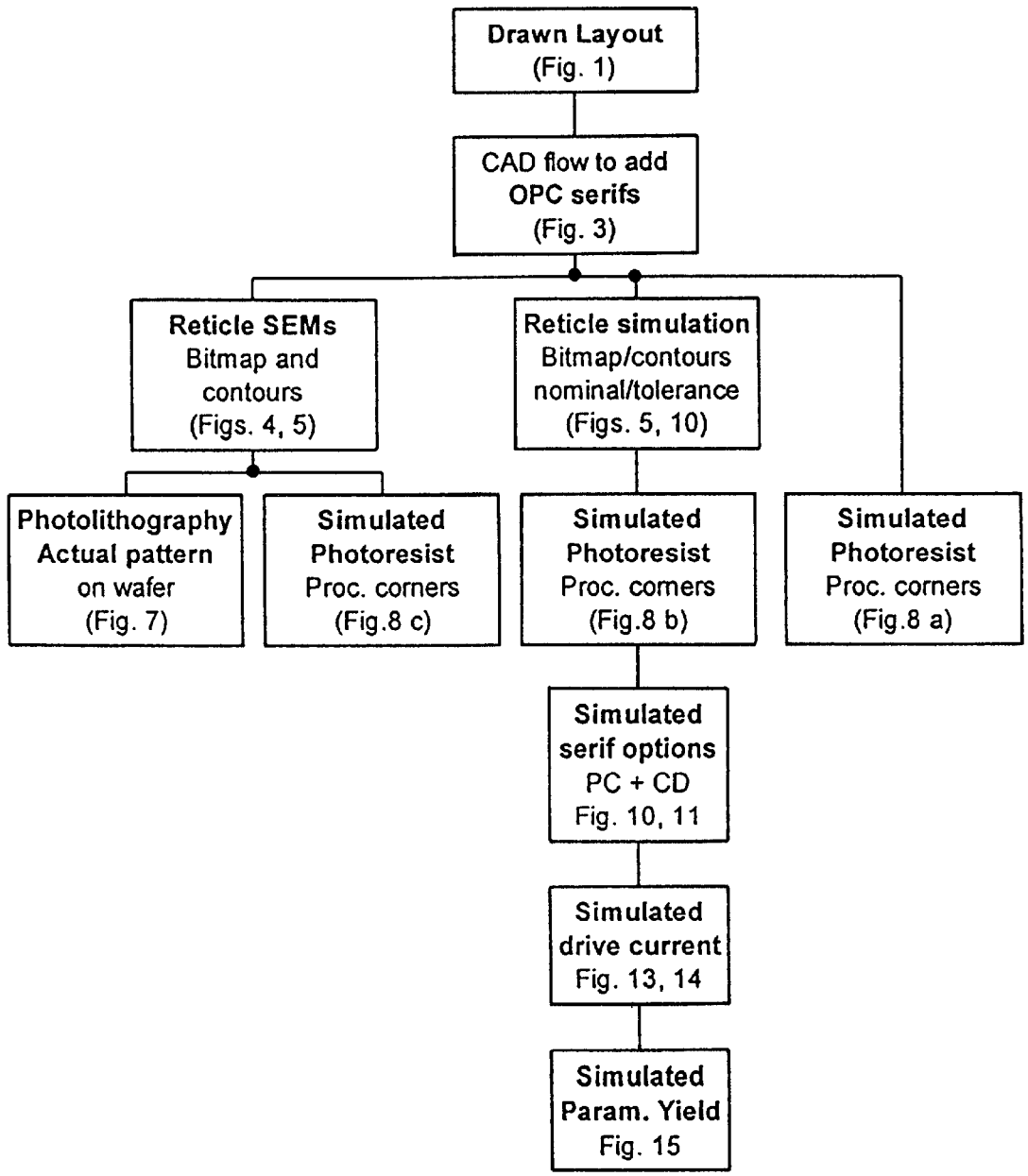
FIG. 2 is a schematic of a simulation scheme.

In general, pattern transfer from design to wafer involves mask generation followed by photolithography. We adopted a corresponding two-step optical simulation scheme included as part of the overall process in FIG. 2. A suitable scheme is described in U.S. Provisional Patent Application Serial No. 60/142,298, filed Jul. 2, 1999, hereby incorporated by reference. We first simulated the reticle followed by simulating the photoresist pattern on silicon. First level inputs, drawn design plus OPC serifs (hammerheads) (FIG. 3), were used to generate a bitmap of the mask. Second level input was either the drawn design with OPC serifs (control), the extracted bitmap of the mask simulated in the first round (the actual two-step simulation), or the extracted bitmap of the real mask based on its SEM image (calibration of the simulation, FIG. 4).

In the mask simulation, we used standard illumination with drawn feature sizes blown up by 4x, to provide the desired effect of mask corner rounding. Bitmaps for the second step of the simulation were obtained from the aerial image of the intensity contour corresponding to the target FET CD (here, 28% intensity).

Figure 4:
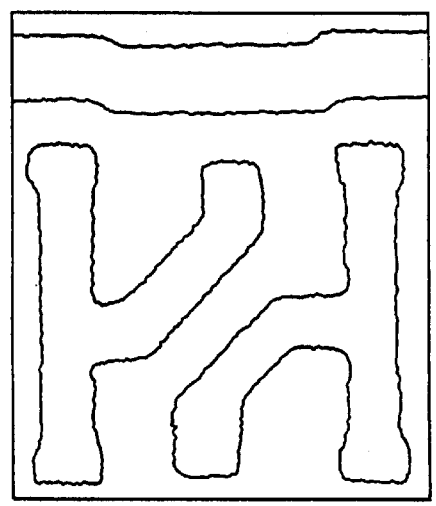
FIG. 4 is an SEM picture of a gate mask.
Figure 5A:
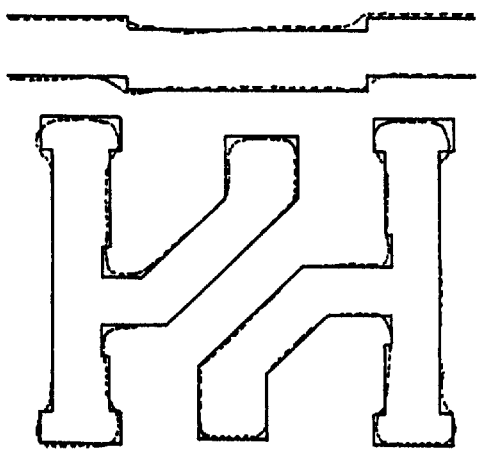
FIG. 5a is an SEM contour of a gate mask overlaid with a corresponding drawn layout.
Figure 5B:
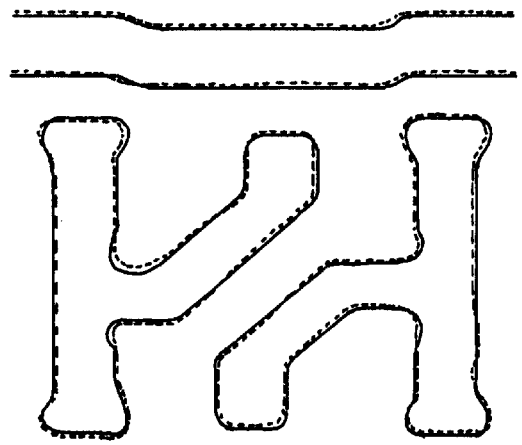
FIG. 5b is an SEM contour of a gate mask overlaid with a corresponding simulated mask.
Figure 6A:
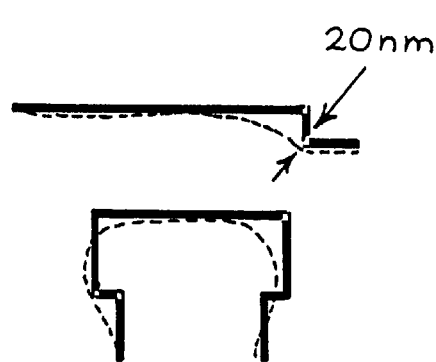
FIGS. 6a and b are a comparison of the accuracy of the overlays of FIGS. 5a and b, respectively.
Figure 6B:
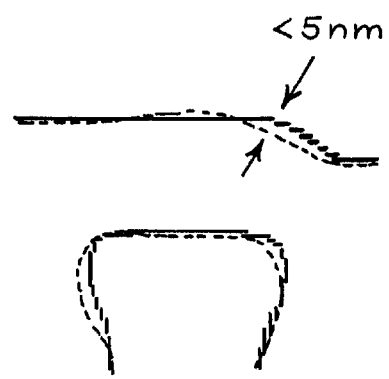

A comparison of FIGS. 3 and 4 shows line end rounding of hammerheads due to the mask writing process. FIG. 5 shows contour overlays: simulated mask, drawn data and SEM image. FIG. 6, a detailed view of the gate line end, shows that mask corner rounding was simulated with the accuracy of about 5 nm, compared to the much worse accuracy of drawn layout to mask overlay of about 20 nm.

To simulate or print photoresist on a wafer, annular illumination (NA=0.6, 0.75/0.45 outer/inner diameter) may be used. The simulated intensity contour of 30%, called the CD contour, corresponded to the channel length (CD). At the same time, the effects due to the exposure defocus and photoresist scumming were modeled by the intensity contour of 10% higher than that of the CD contour, referred to as the Process Corner (PC) contour.

Figure 7:
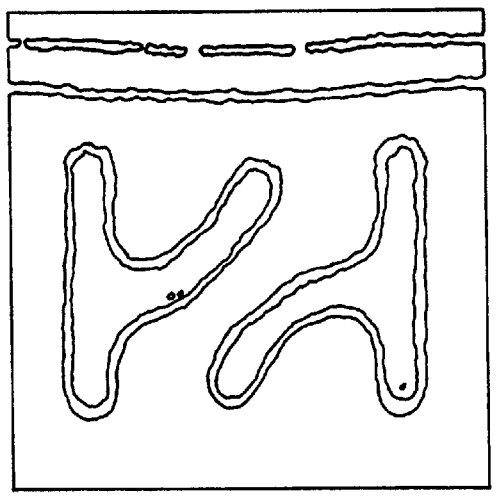
FIG. 7 is an SEM picture of a gate pattern on a wafer.
Figure 8A:
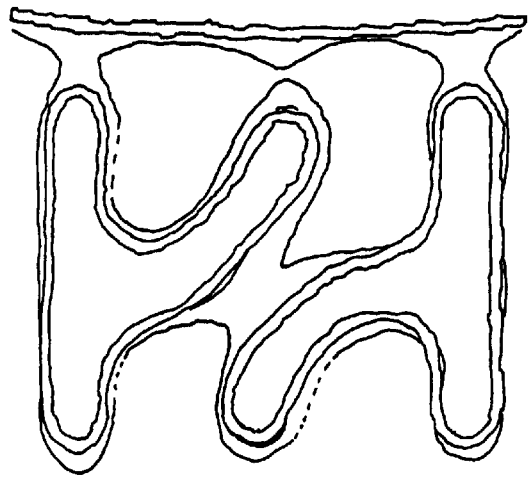
FIGS. 8a, b and c, are SEM contours of a gate pattern on a wafer overlaid with process corner contours simulated from a drawn layout, a simulated mask, and an SEM bitmap of the mask, respectively.
Figure 8B:
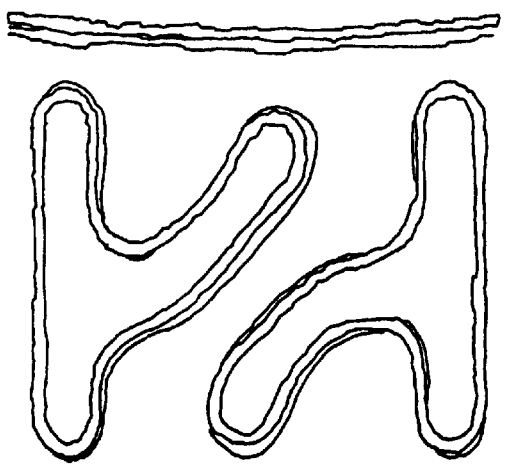
Figure 8C:
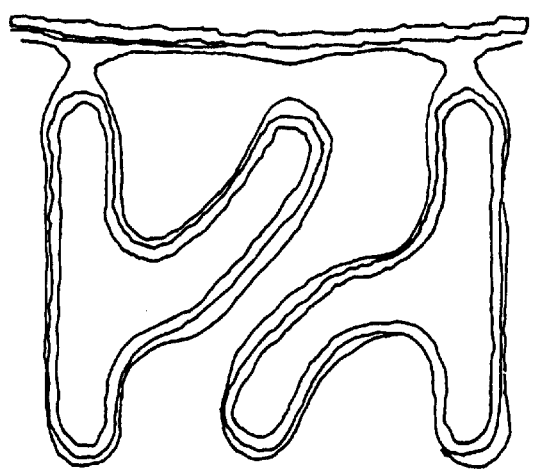

The entire process of optical simulation from mask to a pattern on a wafer, was calibrated based on SEM images of the photoresist (FIG. 7). FIGS. 8 and 9 show the overlay of the final pattern and intensity contours simulated from: a) drawn layout, b) simulated mask, c) SEM of the mask. The best agreement was achieved for the simulated mask pattern.

B. Electrical Simulation.

Figure 10C:
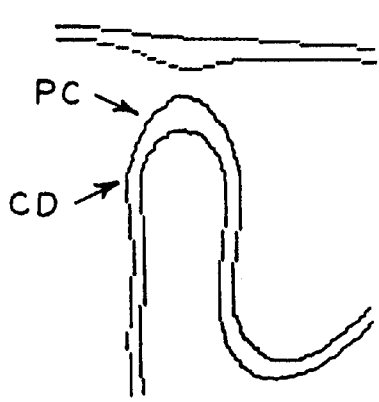
FIGS. 10c and d show corresponding aerial images of FIGS. 10a and b gate process corner PC (outside) and critical dimension CD (inside) intensity contours.
Figure 10D:
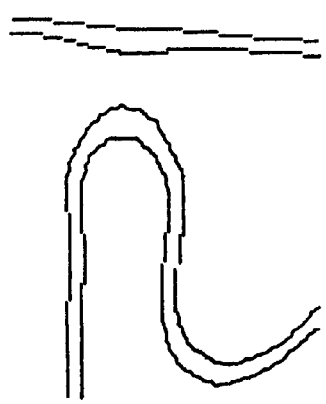
FIGS. 10a and b illustrate details of a simulated gate mask with two serif sizes within mask tolerance.
Figure 11:
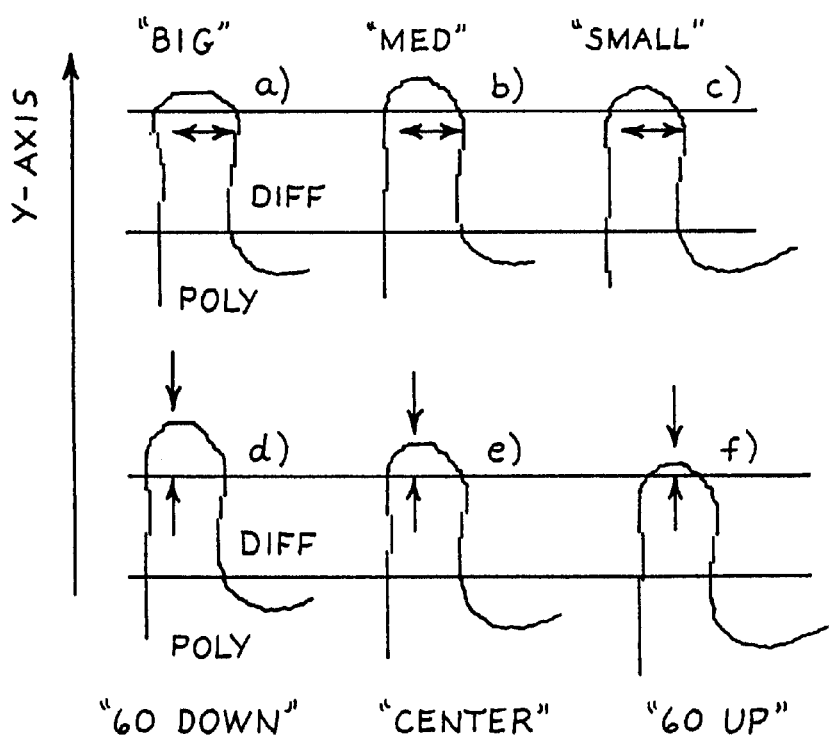
FIG. 11 illustrates different gate shapes and alignments.

Having calibrated optical simulation from design to a gate pattern on a wafer, the effect of mask variation and misalignment on optical proximity and the resulting degradation of transistor performance and parametric yield were then simulated. As a first step, the effect of serif size variation within mask CD tolerance was examined, at mean to target difference of 10 nm (1x). FIG. 10 shows a detailed view of a simulated mask corresponding to such serif variations, and the corresponding CD and PC intensity contours. The photolithography magnifies the barely visible difference of serif size and creates channel length distribution along its width. This, combined with gate misalignment, affects MOSFET drive and leakage currents. FIG. 11 shows examples of gate/diffusion overlay, for the different serif size and misalignment options. One can expect that, compared to the nominal serif (center, FIG. 11b), too large serifs (11a) increase the margin of misalignment, but reduce drive current, whereas too small serifs (11c) make the transistor susceptible to short channel effects.

To estimate the impact of corner rounding, CD variations, and misalignment on transistor performance and yield, the width of simulated poly gates was measured at a number of locations. The channel was divided into small sections across its width and a statistical distribution of MOSFET gate lengths was extracted. It was necessary to assume that the gate length varies slowly across the MOSFET width in comparison to the line width itself. This is a valid assumption since the relevant curvature radius cannot be smaller than the stepper wavelength. As a result, each transistor in the cell was viewed as a number of connected narrow transistors (slices) of varying gate lengths. Here, the channel was divided into 16 sections, each one 20 nm long. A more accurate but less preferred approach is to solve Poisson's and continuity equations in three dimensions over the entire channel region. However, the simpler approximation was sufficient for yield evaluation to sort out the "passing" and "not passing" devices.

C. Yield Simulation.

Figure 12A:
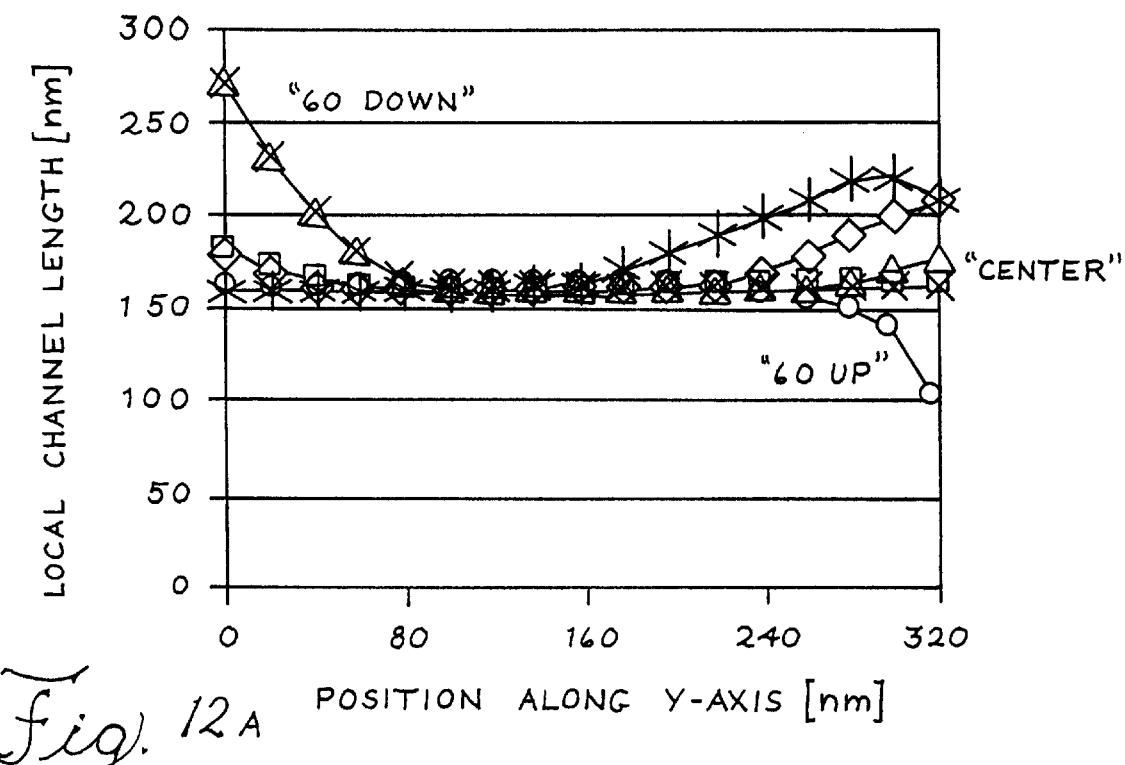
FIG. 12a is a graphical summary of channel length, L, distributions along the Y-axis from FIG. 11.

The above assumption allowed statistical analysis of transistor performance and yield to be carried out. The properties of cell transistors were estimated by the statistical distribution of poly line widths. FIG. 12a shows channel length dependence on the position along the y-axis in FIG. 11, for the different misalignment options.

Figure 12B:
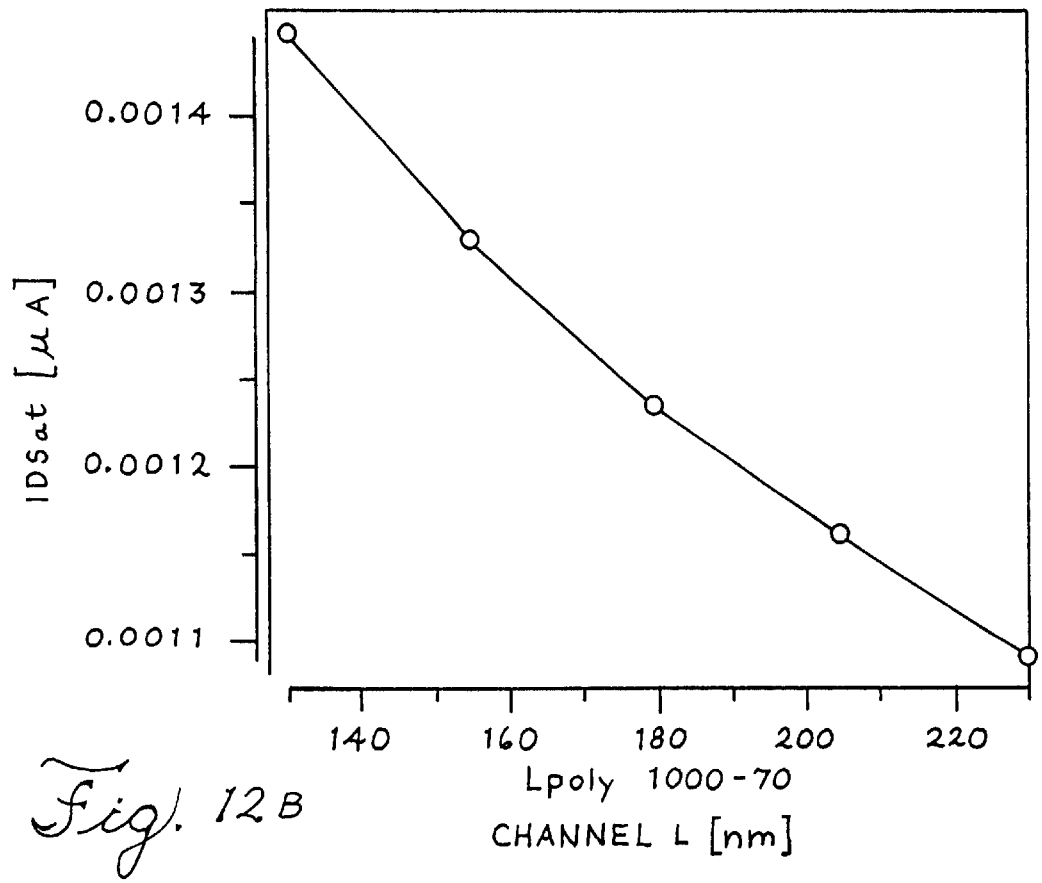
FIG. 12b is a calibration curve for drive current vs. channel length.
Figure 13:
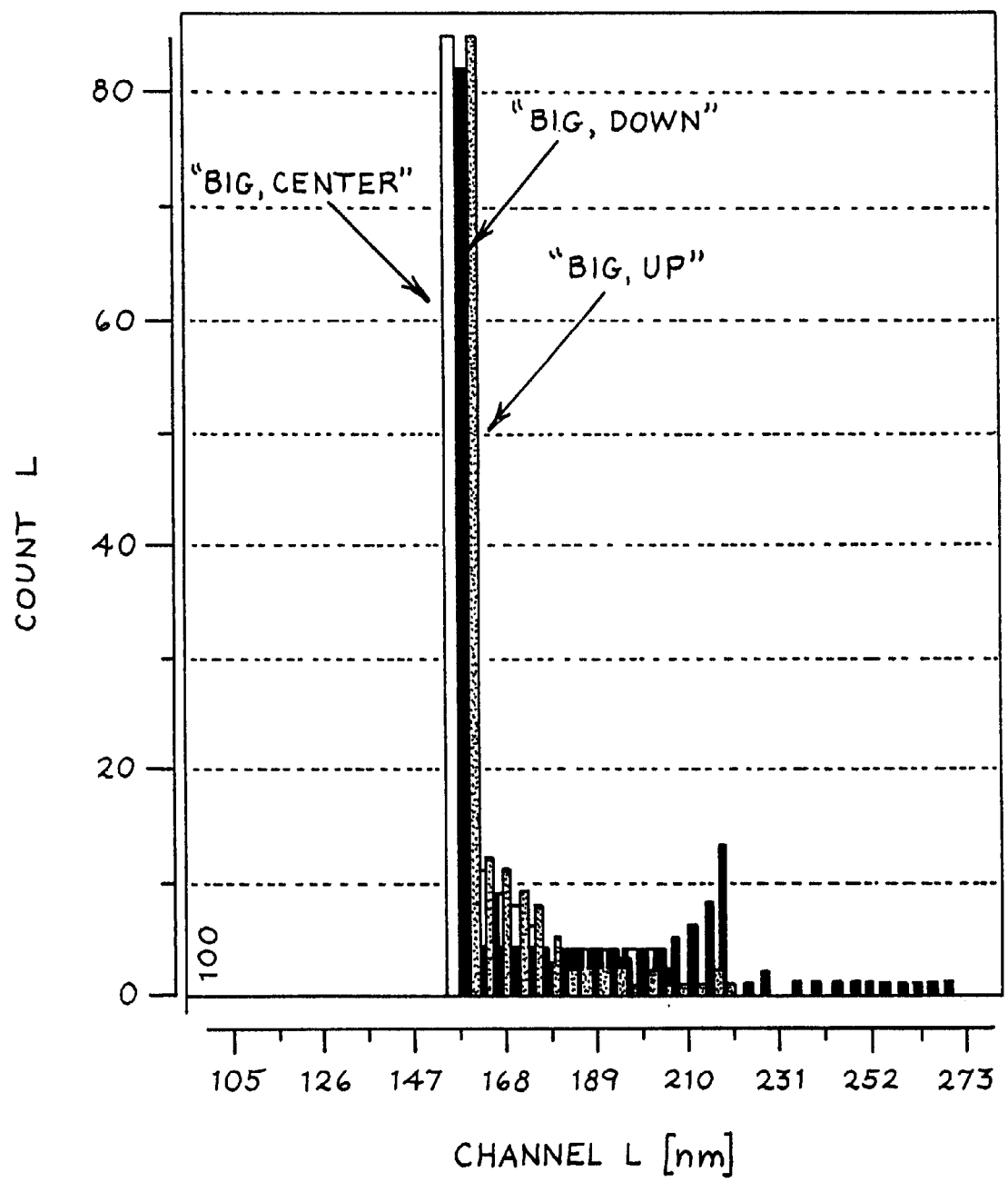
FIG. 13 is an example of an input drive current simulation.
Figure 14:
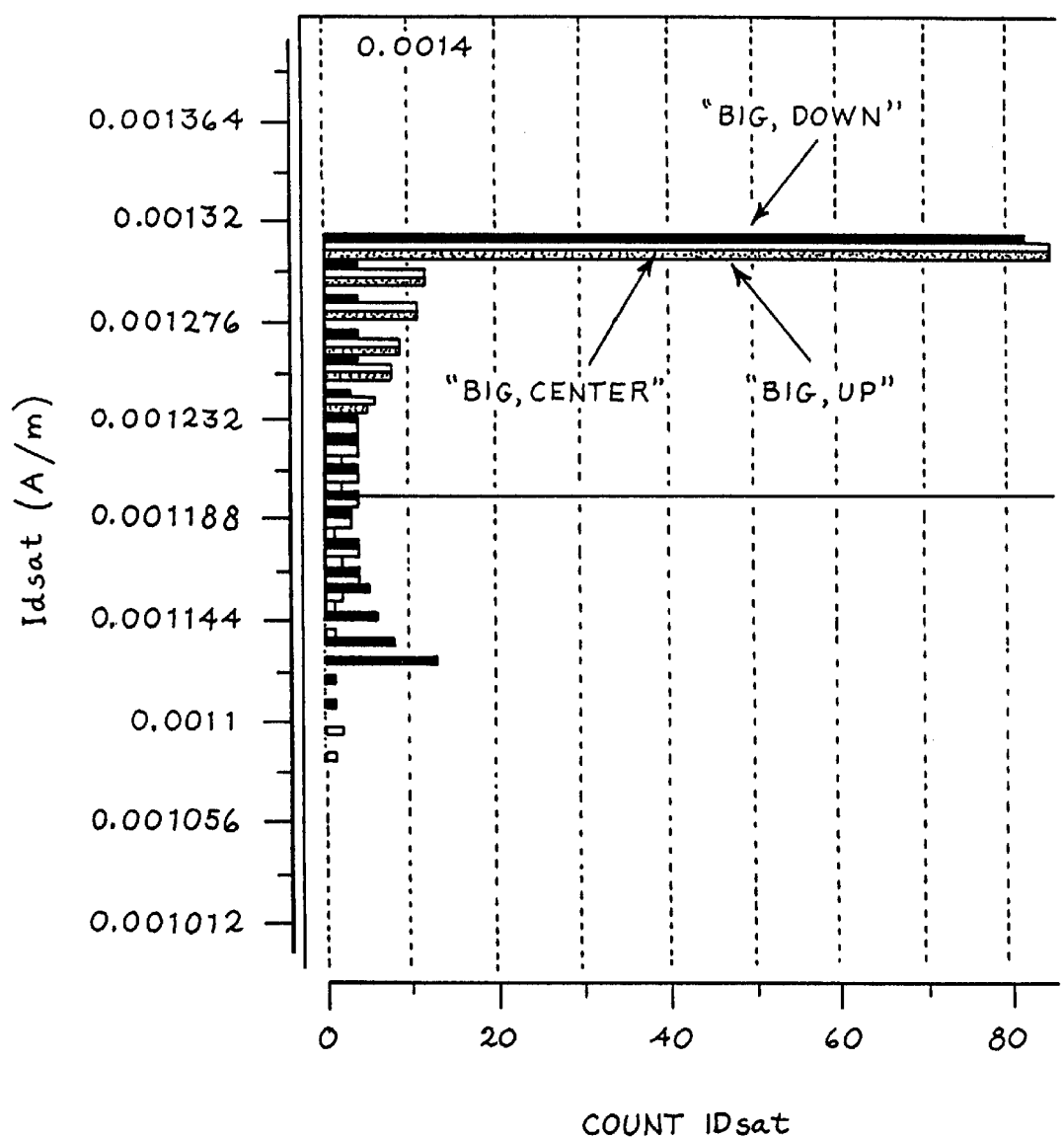
FIG. 14 is a histogram of drive current distribution based on data from FIG. 13 and the calibration curve of FIG. 12b.
Figure 15:
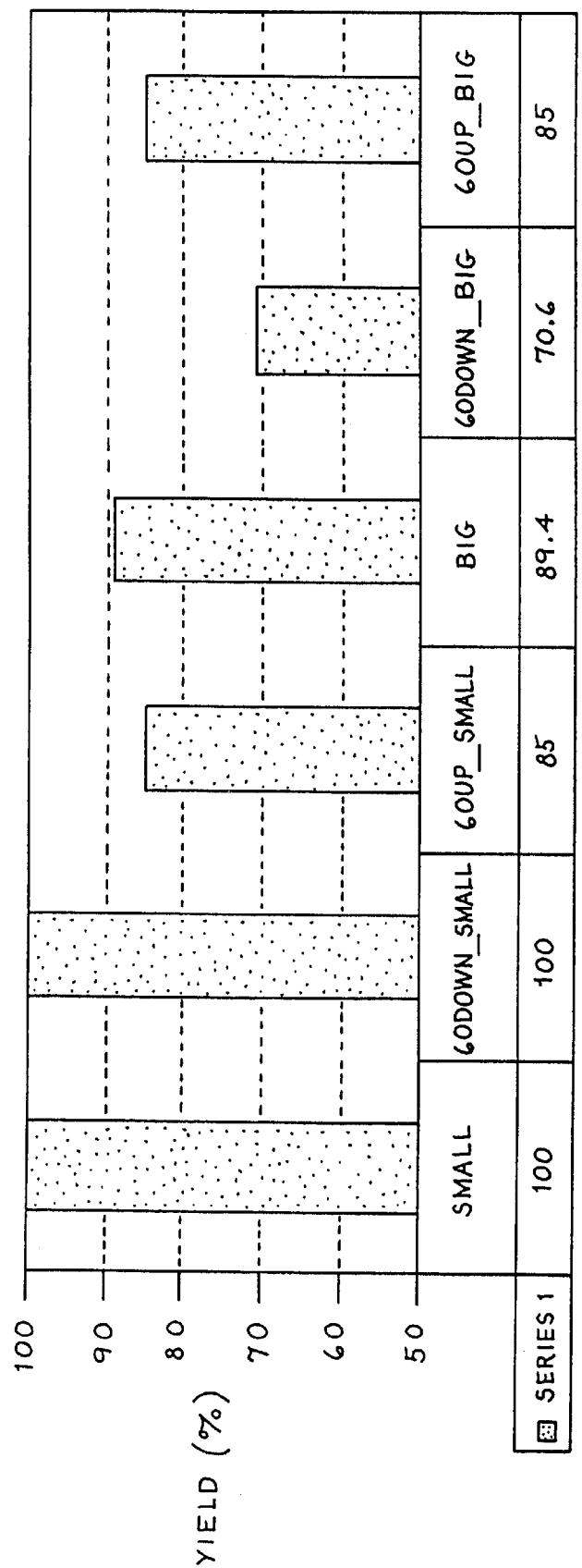
FIG. 15 is a graph of yield estimates assuming different misalignment options from FIG. 11.

Depending on the technology, a transistor may be more or less sensitive to gate length variation. Here, a simulated drain saturation current $I_{DSat}$ vs. channel length $L_{poly}$ dependence shown in FIG. 12b was used. For each misalignment condition, yield estimates were generated based on channel length and drive current histograms shown in FIG. 13. These histograms were then mapped into $I_{DSat}$ histograms (FIG. 14) using the $I_{DSat}$ vs. $L_{poly}$ curve from FIG. 12b. Yields were estimated for each misalignment option by calculating a percentage of samples with low $I_{DSat}$ or high leakage. FIG. 15 shows that final yield loss may range up to 30%.

Die-to-die and wafer-to-wafer variability and the corresponding yield losses may be considered by generating gate length curves as shown in FIG. 12a for the expected lithography and etch variations. This would affect the calculated gate length and $I_{DSat}$ histograms, and would be reflected in the yield loss.

Based on the assumed process margins for photomask generation and photolithography, parametric yield of a high density SRAM cell was evaluated. A yield loss on the order of 30% was the result of serif size variation combined with misalignment. In the case when unacceptable yield loss emerges from the simulation, the cell may be redesigned, or better stepper and reticle grade may be used. The process may then be repeated. Once an acceptable yield loss emerges from the simulation, the actual device may be manufactured.

EXAMPLE 2

Figures 16, 17:
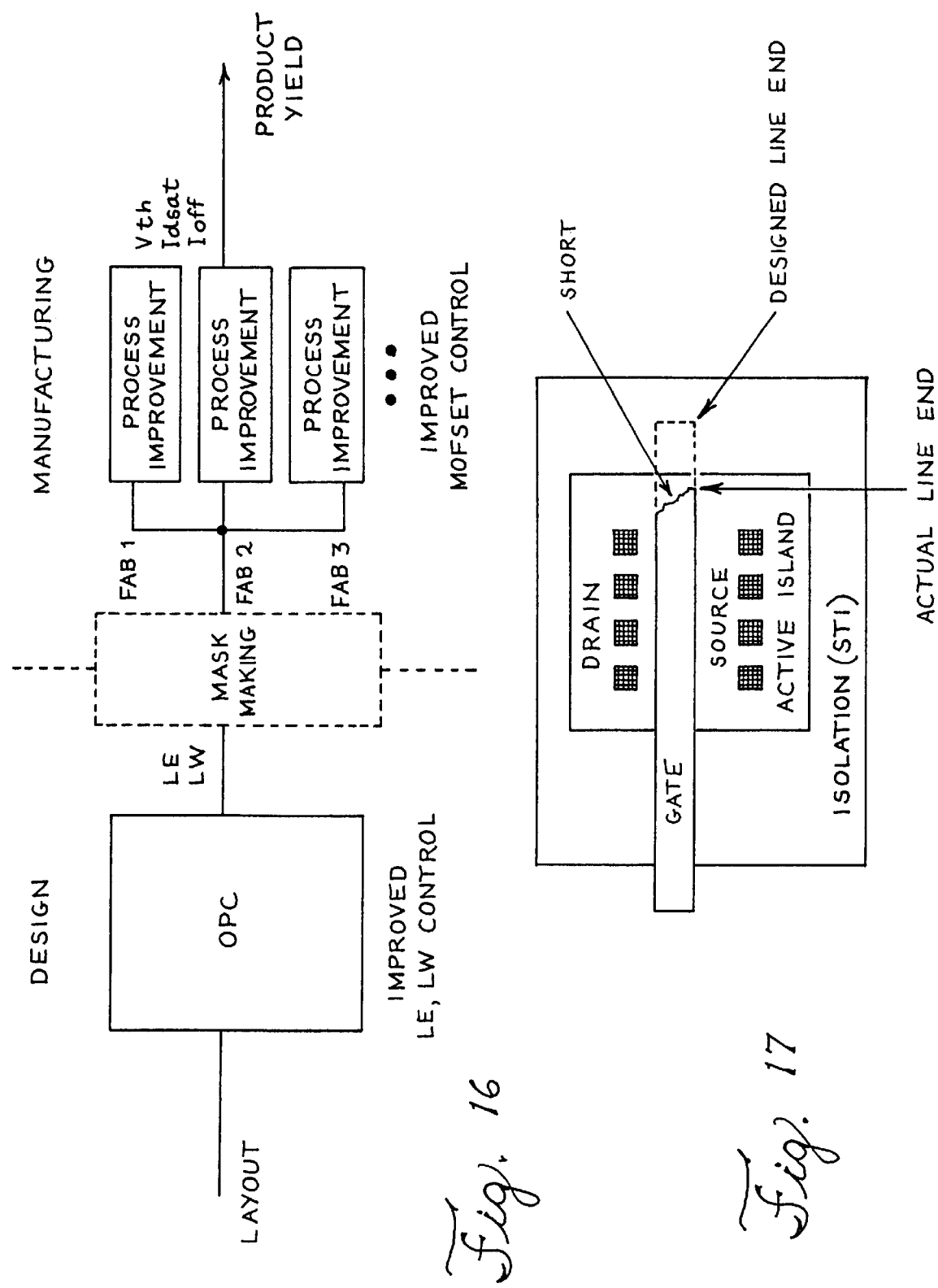
FIG. 16 is a schematic representation of design phase and manufacturing phase yield optimization.
FIG. 17 illustrates how line-end rounding and shortening can lead to catastrophic failure.
Figure 18:
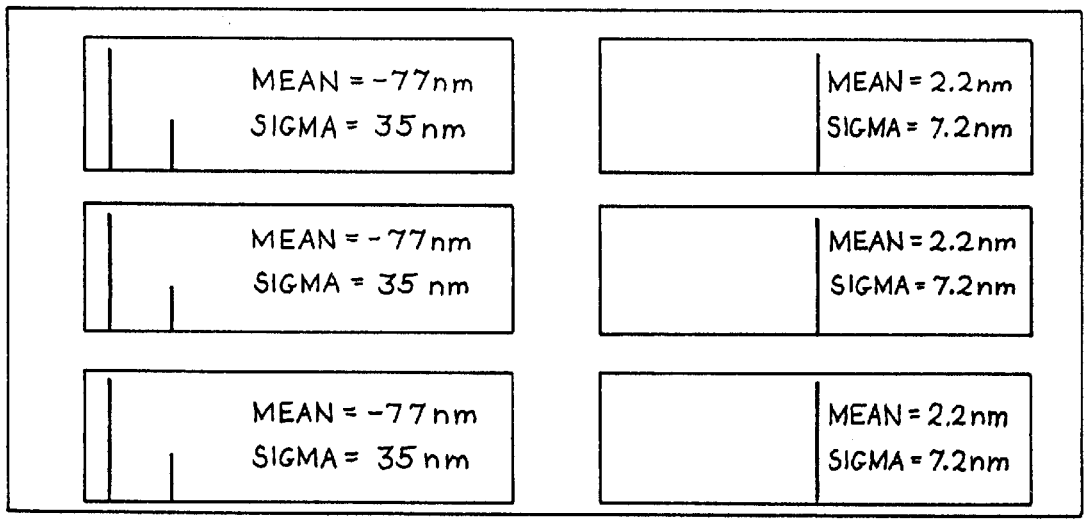
FIG. 18 shows on the left side a distribution of line-end placement errors for a test chip (0.25 µm design rules). Errors are defined as the distance between the actual and designed line-end locations. On the right is shown line-end placement errors after OPC for the test chip using the corrective hammerhead structure described on the far right.

Line-end registration is an important criterion for pattern fidelity since excessive line-end shortening can cause MOSFET failures, as illustrated in FIG. 17. Line-end reduction of poly over active can lead to transistor short channel effects (threshold voltage variations, low punch through, and high leakage). A distribution of line-end placement errors extracted for a test chip (containing line patterns drawn at 0.25 $\mu$m design rules in various configurations and pitches) is shown in FIG. 18, left. Significant shortening of lines up to 130 nm due to optical proximity effects is clearly visible. If uncorrected, they would lead to catastrophic failures of the type indicated in FIG. 17 (i.e. short-channel effects and possibly shorts).

In order to prevent line-end shortening, full-chip automated OPC was applied to the test chip. By adding hammerhead serifs to the ends of poly lines, it was possible to dramatically reduce both the mean value and the variation of poly line end reduction, respectively from 77 to 2.2 nm and from 35 to 7.2 nm (FIG. 18, right). It is significant that after correction, the distribution became much closer to one of a Gaussian type, indicating that the first order problem has been solved by OPC and the residual error is random. Given a specification limit for line-end placement errors, the lithographic yield can be estimated using (EQ 3). The actual limit value depends on the process technology and the design safety margin:

TABLE 1

Line-end lithographic yield as a function of spec limit

| Allowed line end reduction | Yield before OPC | Yield after OPC |
|---|---|---|
| 12.5 nm | 1.0% | 97.7% |
| 25 nm | 5.5% | 99.9% |
| 50 nm | 28.8% | 99.9% |

Figure 19A:
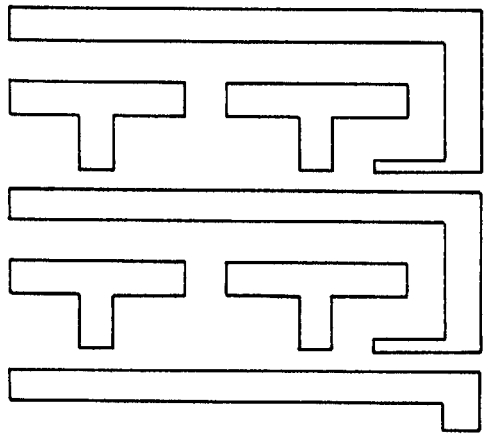
FIG. 19A shows the initial design layout before OPC, and FIG. 19B. shows the corresponding SEM of a wafer after poly etch.
Figure 19B:
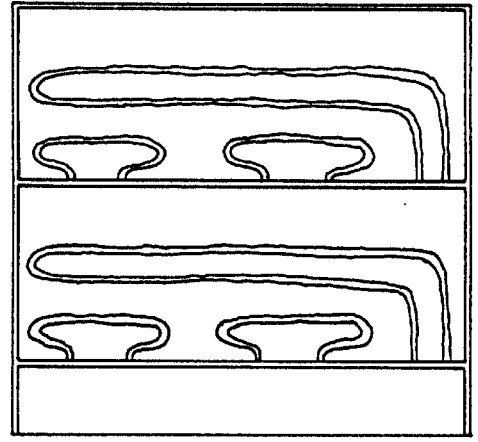
Figure 20A:
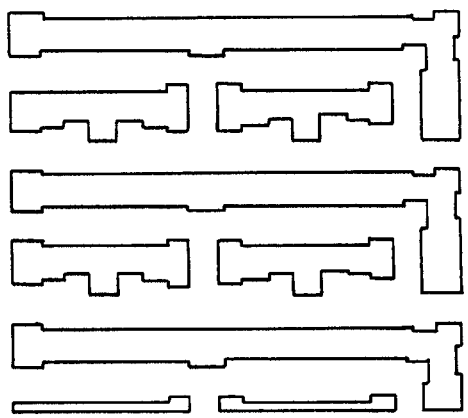
FIG. 20A shows the corrected design layout after OPC, and FIG. 20B. shows the corresponding SEM of a wafer after poly etch.
Figure 20B:
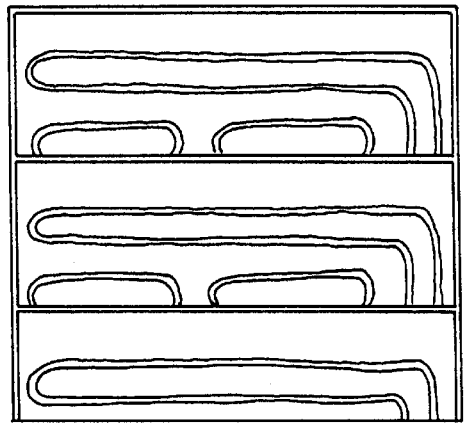

FIGS. 19A and B, and 20A and B, illustrate layout modifications introduced by OPC and the resulting pattern changes.

Poly linewidth variability (called critical dimension or CD variation) determines circuit variability and, therefore, the yield and performance of the product. However, the mapping from linewidth to transistor parameters is nonlinear, which can produce highly detrimental non-normal distributions.

Figure 21:
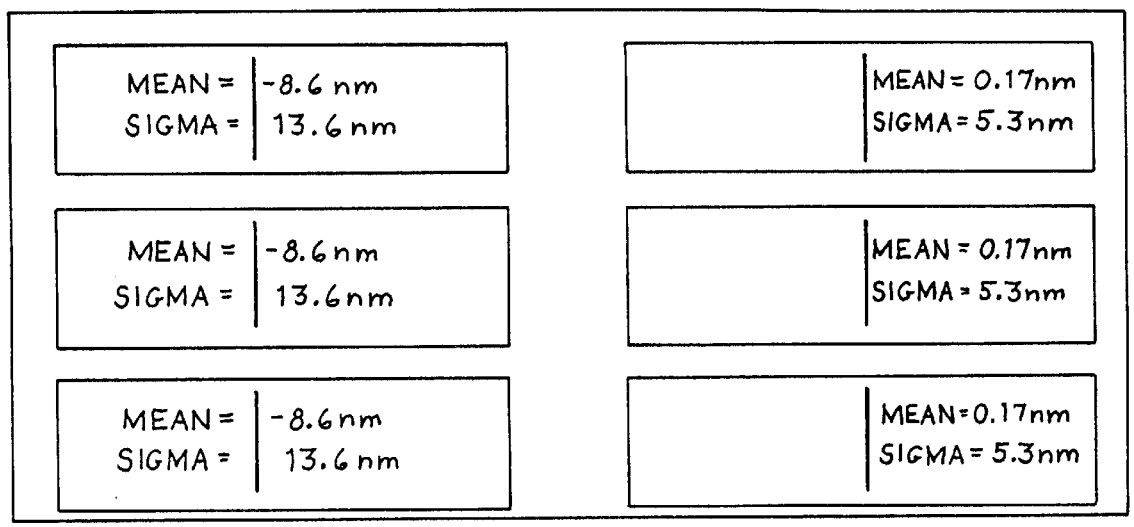
FIG. 21 shows on the left side linewidth errors before OPC, and on the right side linewidth errors after OPC. The distribution has shifted and narrowed by 2.5×.

MENTOR GRAPHICS CALIBRE OPC software was used to extract the distribution of linewidth errors for the test chip. OPC was applied and then linewidth errors were re-extracted. Results are shown in FIG. 21 (on the same scale as FIG. 18). As with line-ends, we see that OPC solves the systematic linewidth narrowing and reduces the standard deviation of the distribution by about 2.5×.

Figure 22:
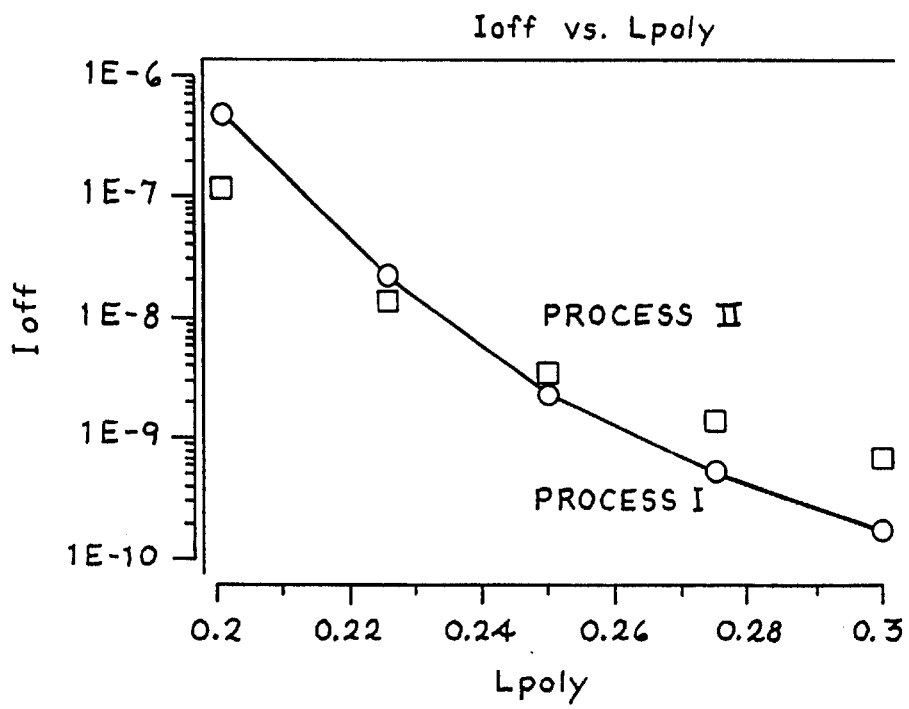
FIG. 22 is a graph showing leakage currents Ioff (A/mm) versus Lpoly for two process technologies.

Transistor parameters were calculated using SEQUOIA DEVICE DESIGNER (SEQUOIA DEVICE DESIGNER User's Manual, SEQUOIA DESIGN SYSTEMS, 1999) for two hypothetical front-end processes, each optimized to produce the same saturation current at the target gate length of 0.25 microns. Compared to the baseline Process I, Process II has a more advanced architecture with a Halo implant (a common technique for 0.25 mm technologies and below) added for better control of short-channel effects. Leakage current (Ioff) versus gate length (Lpoly) is shown in FIG. 22 for both processes. It is seen that Process II (squares) has a weaker Lpoly dependence, thus the same distribution of line-widths will result in a tighter distribution of Ioff than with Process I (circles).

With the calculated dependencies between Ioff and Lpoly, (EQ 3) can now be restated in terms of transistor parameters that can be directly correlated with parametric and speed yield data. As an example, (EQ 4) shows a functional yield definition for a typical dynamic logic product. The speed yield can, in general, be described by a similar expression in terms of saturation current (low current generally means slower product):

$Y_{parametric}$=(number of MOSFETs with Ioff<Ioffmax)/(total number of MOSFETs)  (EQ 4)

Figure 23A:
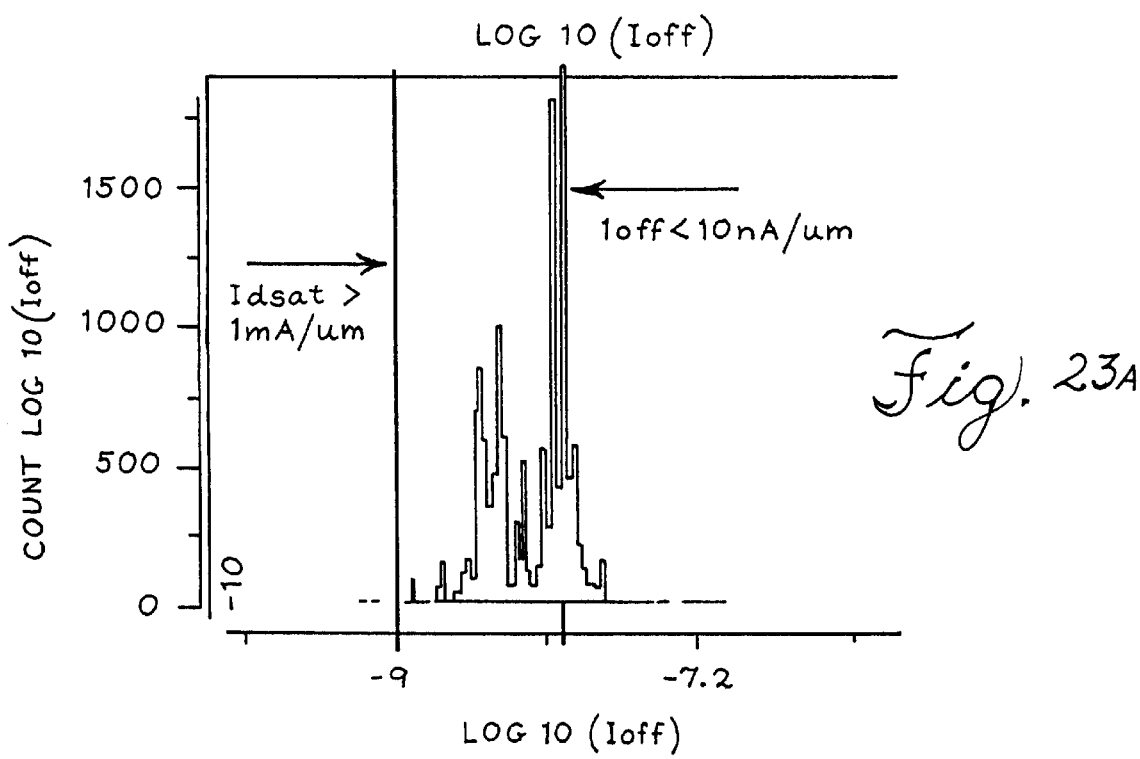
FIG. 23A. shows a graph of leakage current distribution calculated for the test chip before OPC (Process II, 84.6% estimated parametric yield), and FIG. 23B. shows a graph of leakage current distribution calculated for the test chip after OPC (Process II, 100% estimated parametric yield).

Distributions of Ioff are obtained by mapping linewidths data (FIG. 21) to leakage current using the curves in FIG. 22. With these distributions, parametric yield improvements expected from OPC and/or process optimization can now be estimated. As an example, if circuit functional yield demands that a limit of 10 nA/$\mu$m not be exceeded, the yield estimates shown in Table 2 and illustrated in FIG. 23 are obtained.

For speed yield calculation, a lower limit for the drive current must also be considered in an expression similar to (EQ 4). Using 1 mA/mm as an example for a lower Idsat limit, the window in FIGS. 23A and B, and yield estimates in Table 2 are obtained (Ioff and Idsat are strongly correlated for a given process technology. A lower Idsat limit therefore results in an equivalent lower Ioff limit).

TABLE 2

Functional yield estimates based on Ioff >10 nA/mm line-width data.

|  | pre-OPC yield | post-OPC yield |
|---|---|---|
| Process I | 61.8% | 100% |
| Process II | 84.6% | 100% |
|  | (FIG. 8) | (FIG. 8) |

Figure 24:
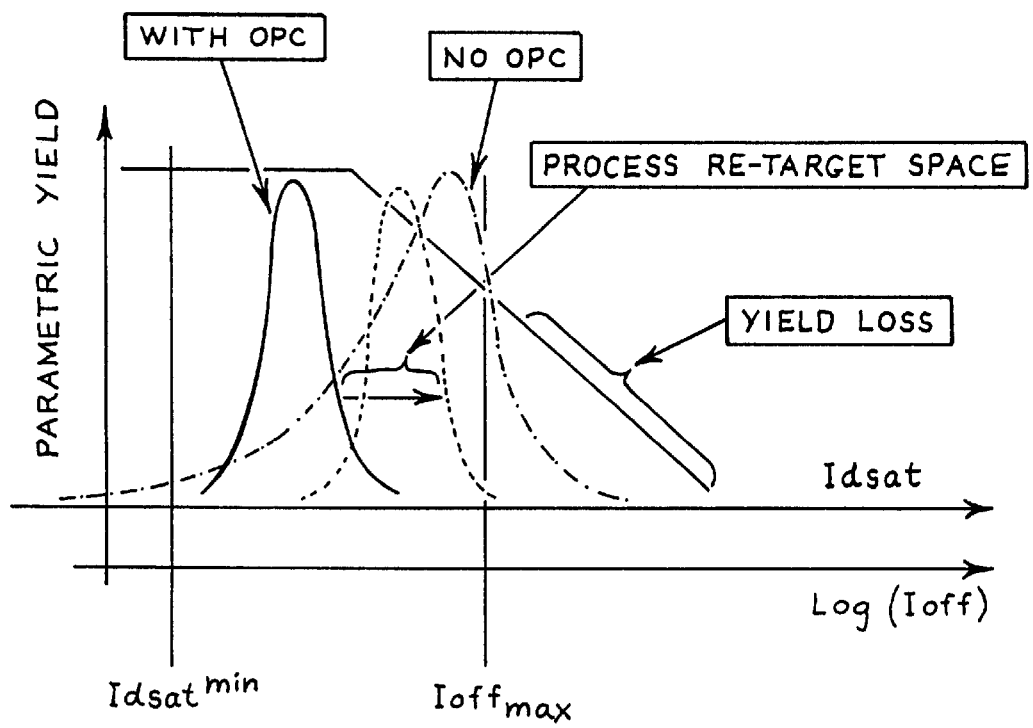
FIG. 24 is an illustration of retargeting the process to take advantage of reduced device variability due to OPC or process improvement.
Figure 23B:
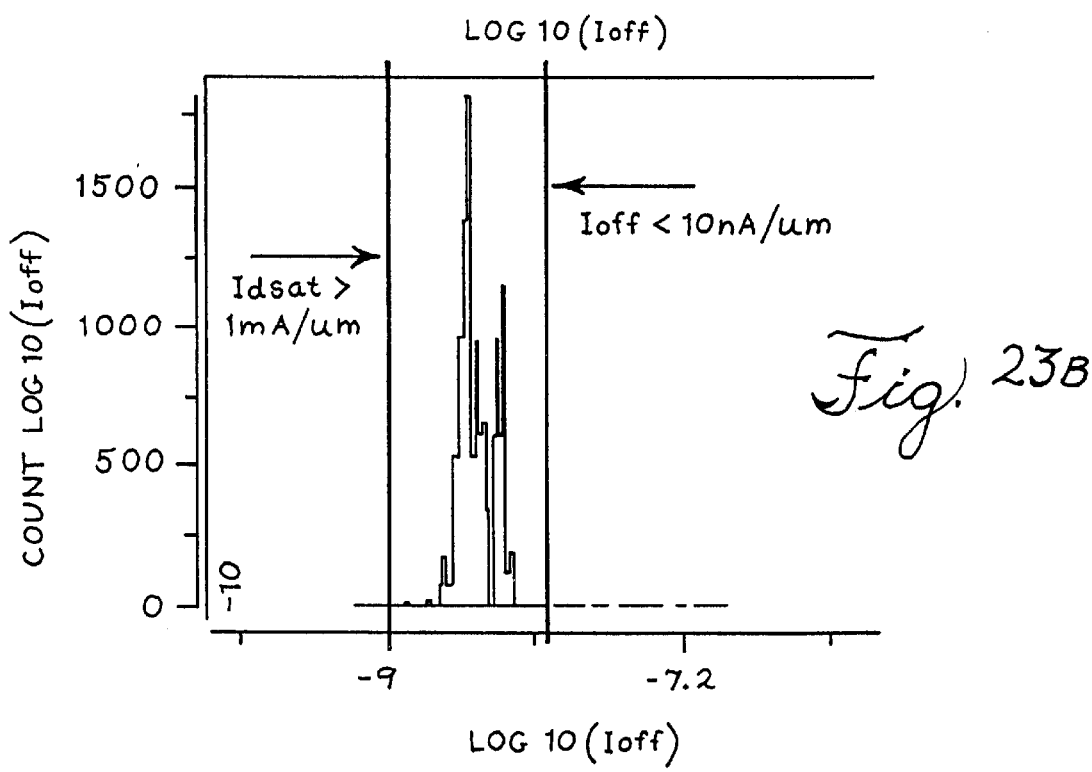

In addition to yield improvement, the combined effect of improved CD control due to OPC and reduced device sensitivity due to process improvement (Process II) in the example offers the ability to improve performance. The distribution of transistor parameters shown in FIG. 23B, is rather narrow in comparison to the original window defined by $Ioff_{max}$ and $Idsat_{min}$. Consequently, the process can be retargeted towards higher Idsat (i.e. higher performance) without incurring any yield losses as shown schematically in FIG. 24. In other words, reducing the tail of the Ioff distribution makes it possible to shift the entire current distribution towards higher values to improve the speed. An example of an entirely integrated software scheme is IC WORKBENCH with the SEQUIA DESIGN TOOL (NUMERICAL TECHNOLOGIES of San Jose, Calif.).

The present invention may be used to determine the device yield of, and design, any semiconductor device, such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Obviously, numerous modifications and variations of the present invention are possible in light of the above teachings. It is therefore to be understood that within the scope of the appended claims, the invention may be practiced otherwise than as specifically described herein.

What is claimed is:

1. A method of determining device yield of a semiconductor device design, comprising:

determining a gate pattern of the device design from a drawn pattern, determining statistics of at least one MOSFET parameter from the gate pattern, and calculating device yield from the at least one MOSTFET parameter, wherein said determining the gate pattern comprises simulating a photoresist pattern.

2. The method of claim 1, wherein said determining the gate pattern further comprises simulating a reticle pattern.

3. The method of claim 1, wherein said determining the gate pattern further comprises preparing a reticle.

4. The method of claim 2, wherein said determining the gate pattern further comprises adding serifs to the drawn pattern.

5. The method of claim 1, wherein said at least one MOSFET parameter comprises channel length.

6. The method of claim 2, wherein said at least one MOSFET parameter comprises channel length.

7. The method of claim 1, wherein said at least one MOSFET parameter comprises gate length.

8. The method of claim 2, wherein said at least one MOSFET parameter comprises gate length.

9. A method of preparing a semiconductor device, comprising:

determining device yield of a semiconductor device design by the method of claim 1, and producing a device corresponding to the semiconductor device design.

10. The method of claim 1, wherein:

said determining statistics comprises step for determining statistics of at least one MOSFET parameter from a gate pattern, and said calculating device yield comprises step for calculating device yield from the at least one MOSFET parameter.

11. A method of making an electronic device, comprising:

preparing a semiconductor device by the method of claim 9, and preparing an electronic device comprising said semiconductor device.

* * * * *

UNITED STATES PATENT AND TRADEMARK OFFICE
CERTIFICATE OF CORRECTION

PATENT NO.   : 6,562,638 B1
DATED        : May 13, 2003
INVENTOR(S)  : Artur Balasinski et al.

It is certified that error appears in the above-identified patent and that said Letters Patent is hereby corrected as shown below:

<u>Title page,</u>
Please delete:
"[73] Assignee: Cypress Semiconductor Corp. (San Jose, CA); Cadence Design Systems, Inc. (San Jose, CA); Sequoia Design Systems (Woodside, CA)" and substitute -- [73] Assignee: Cypress Semiconductor Corp. (San Jose, CA); Cadence (San Jose, CA); Sequoia Design Systems (Woodside, CA) --.

Signed and Sealed this

Sixteenth Day of September, 2003

JAMES E. ROGAN
*Director of the United States Patent and Trademark Office*